(12) United States Patent
Appelt et al.

(10) Patent No.: US 10,707,637 B2
(45) Date of Patent: *Jul. 7, 2020

(54) CW MASER WITH ELECTROMAGNETIC RESONANT CIRCUIT

(71) Applicant: Forschungszentrum Jülich GmbH, Jülich (DE)

(72) Inventors: Stephan Appelt, Aachen-Soers (DE); Martin Süfke, Hürth (DE)

(73) Assignee: Forschungszentrum Jülich GmbH (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/066,440

(22) PCT Filed: Dec. 21, 2016

(86) PCT No.: PCT/EP2016/082050
§ 371 (c)(1),
(2) Date: Jun. 27, 2018

(87) PCT Pub. No.: WO2017/114703
PCT Pub. Date: Jul. 6, 2017

(65) Prior Publication Data
US 2019/0013635 A1    Jan. 10, 2019

(30) Foreign Application Priority Data
Mar. 22, 2016 (DE) .......... 10 2016 204 733

(51) Int. Cl.
*H01S 1/04* (2006.01)
*H01S 1/02* (2006.01)
*H01S 4/00* (2006.01)
*G01R 33/60* (2006.01)

(52) U.S. Cl.
CPC ............ *H01S 1/04* (2013.01); *G01R 33/60* (2013.01); *H01S 1/02* (2013.01); *H01S 4/00* (2013.01)

(58) Field of Classification Search
CPC ............ H01S 1/02; H01S 1/04; H01S 4/00
See application file for complete search history.

(56) References Cited

U.S. PATENT DOCUMENTS

| 3,075,156 A * | 1/1963 | Anderson ............ G01N 24/00 324/307 |
| 3,195,061 A | 7/1965 | Jeffries et al. |
| 3,350,632 A | 10/1967 | Robinson |
| 3,439,288 A | 4/1969 | Mangin |
| 3,479,608 A | 11/1969 | Ehrlich |

(Continued)

OTHER PUBLICATIONS

Suefke et al., "Spontaneous Transfer of Parahydrogen Derived Spin Order to Pyradine at Low Magnetic Field," 2009, J. Am. Chem Soc., 131, 13362-13368. (Year: 2009).*

(Continued)

*Primary Examiner* — Michael Carter
(74) *Attorney, Agent, or Firm* — Barnes & Thornburg LLP

(57) ABSTRACT

The invention concerns a maser having an electromagnetic resonant circuit comprising a pick-up coil, a capacitance and a filter coil, an active medium of organic or maser-capable molecules in the pick-up coil as well as a population inversion device for generating a population inversion in the active medium.

13 Claims, 2 Drawing Sheets

(56) References Cited

U.S. PATENT DOCUMENTS 5,424,645 A    6/1995 Doty

OTHER PUBLICATIONS

Kevin Atkinson, et al., Spontaneous Transfer of Parahydrogen Derived Spin Order to Pyridine at Low Magnetic Field, J|A|C|S Articles, Sep. 1, 2009, 8 pages.
Liang Jin, et al., Proposal for a room-temperature diamond maser, Nature Communications, Published Sep. 23, 2015, 8 pages.
Mark Oxborrow, et al., Room-temperature solid-state maser, Letter, Aug. 16, 2012, 6 pages.
Martin Suefke, et al., External high-quality-factor resonator tunes up nuclear magnetic resonance, Nature Physics, Jul. 6, 2015, 6 pages.

* cited by examiner

CW MASER WITH ELECTROMAGNETIC RESONANT CIRCUIT

CROSS REFERENCE TO RELATED APPLICATIONS

This application is a U.S. nationalization under 35 U.S.C. § 371 of International Application No. PCT/EP2016/082050, filed Dec. 21, 2016, which claims the priorities to German Patent Application No. 102015226822.5, filed on Dec. 30, 2015, and German Patent Application No. 102016204733.7, filed on Mar. 22, 2016. All of the aforementioned applications are hereby incorporated by reference in their entireties.

BACKGROUND

The present disclosure concerns a maser for the generation of coherent electromagnetic waves. Unlike a laser that emits visible light, a maser generates microwaves or radio waves. A maser comprises an active medium, a device for generating a population inversion in the active medium, as well as a resonator that is tuned to the microwave frequency of the maser. Masers are used, for example, in communication traffic with earth satellites, in radio-astronomic reception systems and radio relay systems as amplifiers, for the operation of atomic clocks and as generator for millimeter waves.

In many cases, low temperatures or a high vacuum must be generated to operate a maser. Usually, complex pumping processes such as beam separation, a pump laser or a dynamic nuclear polarization (DNP) are required.

SUMMARY

It is object of the present disclosure to provide a further developed maser that can be operated at room temperature.

For solving the problem, a maser has an electromagnetic resonant circuit comprising a pick-up coil, a capacitance and a filter coil, an active medium of organic or maser-capable molecules in the pick-up coil as well as a population inversion device for generating a population inversion in the active medium. A maser built in this way can be operated at room temperature and enables continuous microwave radiation or radio wave radiation.

The active medium can also be freely selected so that different maser frequencies can be realized. Using an electromagnetic resonant circuit as resonator enables a small design even at maser frequencies in the MHz range as well as in the kHz range. Frequencies from 1 kHz to 10 MHz are possible.

BRIEF DESCRIPTIONS OF THE DRAWINGS

DETAILED DESCRIPTION

Figure 1:
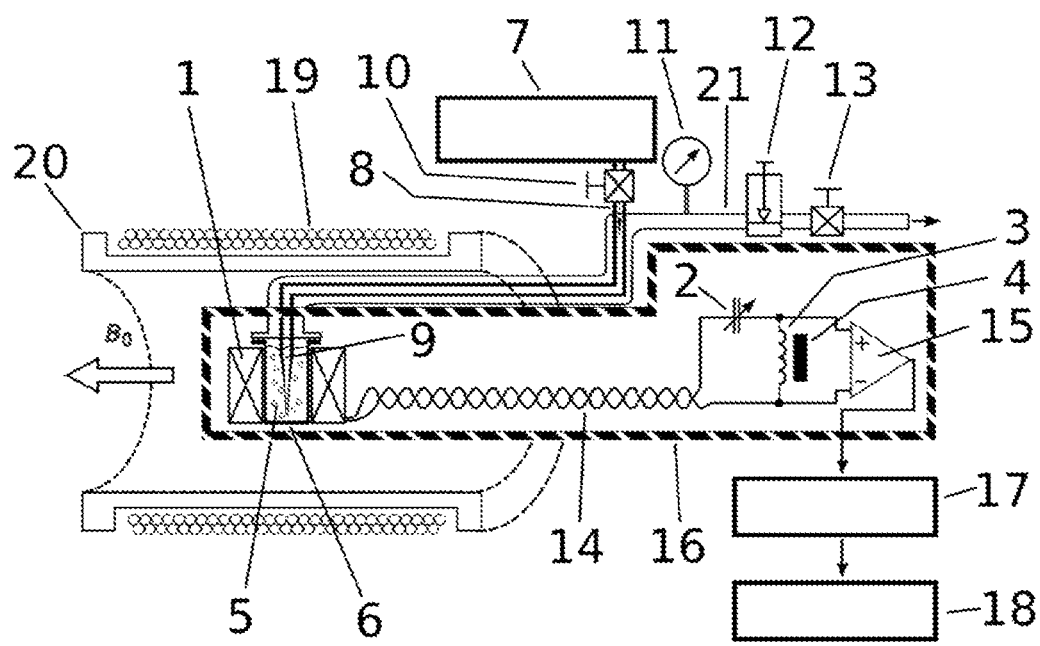
FIG. 1 shows the structure of a maser having an electromagnetic resonant circuit.

A maser according to the present disclosure has an electromagnetic resonant circuit as shown in FIG. 1. The electromagnetic resonant circuit illustratively includes a pick-up coil, a capacitance and a filter coil, an active medium of organic or maser-capable molecules in the pick-up coil as well as a population inversion device for generating a population inversion in the active medium. A maser built in this way can be operated at room temperature and enables continuous microwave radiation or radio wave radiation.

The active medium in the electromagnetic resonant circuit can also be freely selected so that different maser frequencies can be realized. Using an electromagnetic resonant circuit as resonator enables a small design even at maser frequencies in the MHz range as well as in the kHz range. Frequencies from 1 kHz to 10 MHz are possible.

In one embodiment of the present disclosure, the population inversion device is composed in such a way that nuclear spins of organic or maser-capable molecules can be brought to negative spin temperature by the population inversion device and the population inversion thereby obtained. This embodiment makes it possible in an advantageous manner to allow dispensing with optical pumping, beam separation or DNP processes. A frequency range of up to four orders of magnitude can also be covered, in particular a frequency range of one kHz to 10 MHz. Despite the comparatively small frequencies, no large installation space is required, as an electromagnetic resonant circuit and no cavity resonator is used.

In one embodiment, it is pumped chemically, preferably by means of para hydrogen, in order to thereby obtain a negative nuclear spin temperature at the organic or maser-capable molecules of the active medium. This is carried out in particular by means of a catalyst to which the organic or maser-capable molecules of the active medium and the para hydrogen can dock. The para hydrogen can then transfer its nuclear spin to the organic or maser-capable molecules in order to thereby achieve a population inversion. The technical effort is low, in particular compared to the technical effort that is required to operate an optical pump. In this way, a maser can be provided that is capable of continuously generating coherent electromagnetic waves, i.e. a so-called CW maser. A CW maser allows very accurate measurements over long periods of time, which is not possible with a pulsed maser in the same way. With such a CW maser, for example, a very precisely working NMR sensor or magnetic field sensor is realized.

Preferably, the active medium is a liquid. Compared to a gaseous medium, high spin densities can be achieved, which contributes to allow providing a CW laser with low technical effort. Compared to a solid medium, significantly less energy has to be spent for the generation of a population inversion. Also for this reason it is possible to provide a CW maser without having to spend excessively high effort for it.

In one embodiment, the active medium is a solid, in particular consisting of or comprising soft polymers.

In one embodiment, the population inversion device is arranged in such a way that the corresponding organic or maser-capable molecules of the liquid are separated such that a medium with negative spin temperature is thereby provided.

A separation method of such kind is carried out in one embodiment for hydrogen in such a way that the para hydrogen that is contained in the hydrogen is separated. This separated para hydrogen is used for chemical pumping in order to thereby generate a negative spin temperature in the active medium. Alternatively, para hydrogen can be obtained by means of conversion. Such a conversion is generally conducted at low temperatures.

Negative spin temperatures occur when the higher energy level that a nuclear spin can take up is occupied more strongly than the lower energy level.

When having more than one spin type, there is also the possibility to generate more complex non-equilibrium occupations with a higher multipole order or a partial population inversion. A maser from such conditions has not yet been demonstrated. This fundamentally different principle could be realized by designs in accordance with the present disclosure in addition to the conventional population inversion. This represents a partial population inversion within the meaning of the present disclosure.

The organic or maser-capable molecules with negative spin temperature are polarized. The earth's magnetic field or a magnetic field, which is weaker than the earth's magnetic field due to a magnetic shielding, is sufficient for this. Polarization means an ordered alignment of nuclear spins in the active medium. There are different order classes of spin states: The single spin (dipole), two spin (quadrupole) and multi-spin arrangement (multipole). An inverted dipole state (single spin state) is also called occupation inversion, which corresponds to a negative spin temperature. A high degree of polarization is more favorable than a low degree of polarization. Therefore, hyperpolarization is preferred, i.e. an ordered alignment of nuclear spins in the active medium far beyond the thermal equilibrium.

An example of organic molecules with which the disclosed design was realized is pyridine, i.e. $C_5H_5N$, or acetonitrile, i.e. $CH_3CN$. These were dissolved in a solvent, namely methanol.

It turned out that the properties of the resonator can be improved with increasing reduction of the installation space. In particular, the pick-up coil is preferably small. A reduction in installation space of the pick-up coil and thus also of the active maser medium improves advantageously the coupling of the active maser medium to the resonator. In contrast thereto, the quality of the masers known from the state of the art increases with the size of the installation space. The latter applies, for example, to the maser known from the document DOI: 10.10.38/MPHYS3382.

Attention has to be paid to provide sufficiently high quality of the electromagnetic resonant circuit for the operation of the maser. Filter coil and capacitance therefore have preferably a high quality of at least 100, advantageously of at least 200, especially preferred of at least 500. Alternatively or additionally, the quality of the resonant circuit is at least 100, advantageously of at least 200, especially preferred of at least 300.

The filter coil has a grounded center tapping in order to obtain a suitable electromagnetic resonant circuit in a technically simple manner.

The quality of the filter coil and the quality of the capacitor generally exceed the quality of the pick-up coil, preferably by many times, at least by twice, especially preferred by at least three times. A cylindrical coil is preferred as the pick-up coil, into which a vessel with an active medium contained therein can be inserted. The pick-up coil can have only a few windings, for example up to 10 windings. Wires or strands from the pick-up coil and/or filter coil can be for example made of copper, silver or gold.

Preferably, the pick-up coil and/or filter coil comprises strands whose thin wires are electrically insulated, in particular through insulating varnish layers, in order to thereby achieve a further improved electromagnetic resonant circuit. Provided strands are therefore preferably high-frequency resistant.

The following embodiments, individually as well as in any combination, improve further advantageous properties of the electromagnetic resonant circuit:

The center tapping is preferably located exactly in the center of the filter coil. The center tapping suppresses parasitic oscillation tendencies of the resonant circuit, specifically particularly well if the center tapping is arranged exactly in the center. This has a positive effect.

The center tapping is realized in one embodiment with an additional wire or strand. One end of the additional wire or strand is connected to ground, i.e. earthed. In addition, one end of the other wire of the filter coil is connected to ground.

For manufacturing, for example two electrical conductors (particularly first and second wire or first and second strand) are twisted with one another or cabled together. Subsequently, the two twisted electrical conductors are wound to the coil. The end of the first electrical conductor (wire or strand) and the opposite end of the second electrical conductor (wire or strand) are then grounded. The other two ends then form the electrical terminals of the coil.

If the two electrical conductors mentioned above have the same length, the center tapping is located exactly in the center.

The filter coil is shielded in particular by an electrical and/or magnetic shield. For magnetic shielding, walls of the shielding consist preferably of Mu-metal or iron, preferably highly permeable iron.

A magnetic shielding is preferably formed by a substantially magnetically closed chamber or can. However, the maser also works without such a shielding. This is realized in the example.

A magnetic shielding protects advantageously against electromagnetic interferences and thus contributes to the improvement of the signal-to-noise ratio.

Walls of the shielding are preferably double-walled, or inside a can there is a second can that is kept at a distance from the first can by means of spacers. The filter coil is then located inside of the second can. Therefore, especially preferred, the shielding consists of a double-walled chamber or double-walled can.

In the case of NMR or ESR spectroscopy, the filter coil can be magnetically shielded from a magnetic $B_0$ field, which is used in the case of NMR or ESR. This shielding provides further improvements.

The walls of a double wall of the magnetic shielding or the walls of one or two cans of the magnetic shielding are advantageously 1 mm to 3 mm thick, such as for example 1.5 mm thick. Walls of an electrical shielding are preferably up to 3 mm thick and/or at least 0.5 mm thick. Walls of an electrical shielding are preferably slotted. The walls of an electrical shielding are made preferably of copper.

The shielding is preferably earthed. In the case of the two cans, generally the outer can is earthed. However, alternatively or additionally, it can also be grounded an inner can.

Advantageously, the pick-up coil is separated from an excitation coil that is used for NMR or ESR spectroscopy. Thus, a second coil is then provided, which is used as excitation coil for conducting NMR or ESR spectroscopy. This makes it possible to optimize the measuring device independently of the excitation coil, which enables an improved signal-to-noise ratio. The pick-up coil is preferably located inside the excitation coil. The distance between excitation coil and pick-up coil is advantageously at least 5 mm, preferably at least 10 mm, in order to keep a disadvantageous coupling between the two coils sufficiently small. The main axis of the excitation coil (=direction rf field) is preferably arranged essentially perpendicular, preferably perpendicular, to the sensitive axis of the pick-up coil in order to keep a disadvantageous coupling between the two coils sufficiently low.

The pick-up coil on the one hand and the capacitor and filter coil on the other hand are in one advantageous embodiment connected to each other by a particularly low-loss electrical transfer line. This is achieved by a transfer line consisting of a good electrical conductor, such as for example by a transfer line consisting of copper, by a large cross-section of a transfer line of for example at least 1 mm², by a looping or twisting of the two electrical conductors of the transfer line, and/or by suitable electrical insulation, in particular by an insulation made of Teflon. Each individual conductor and/or both electrical conductors of the transfer line together can be located in a Teflon sheath for the purpose of insulation. A conductor can be made of a wire or strand.

An independent feature of the present disclosure is provided by a transfer line, which is preferably formed of two strands that are twisted together, which preferably comprising the aforementioned Teflon sheaths, in order to provide a particularly low-loss transfer line for ESR or NMR spectroscopy.

If the transfer line is formed by two strands, said cross-section of at least 1 mm² refers to the sum of the cross-sections of the individual wires of the two strands, specifically including optionally provided insulators. Furthermore, strands of the transfer line are preferably electrically insulated from each other, in particular by varnish surface coating and/or arranged in a high-frequency resistant manner, in order to provide a low-loss transfer line, which leads to a further improved signal-to-noise ratio.

The pick-up coil is preferably formed by a strand, i.e. by an electrical conductor consisting of thin individual wires. The individual wires of the strand are advantageously electrically insulated from each other. The surfaces of the individual wires are therefore advantageously provided with an electrically insulating varnish. The strand is preferably high-frequency resistant.

A toroidal or cylindrical filter coil with winding of stranded wire has proven to be suitable. For the realization of an external resonator with high qualities $Q_E$>1000, the filter coil should follow an alternating magnetic field with the lowest possible energy loss or exhibit a low AC loss. For this, the filter coil must have a negligible magnetic stray field, and the AC resistance of the winding should be as low as possible. Also other losses such as e.g. dielectric losses or losses in the magnetic core of the filter coil should be minimized.

Advantageously, the distance between pick-up coil on the one hand and capacitor and filter coil on the other hand is at least 5 cm, advantageously at least 50 cm, especially advantageously at least 60 cm. This reduces a mutual disturbing magnetic influence between a $B_0$ field, as it is present in case of an ESR or NMR spectroscopy, and the usually shielded filter coil. It is achieved that a shielding does not disadvantageously affect the $B_0$ field. It is furthermore avoided that the shielding is disadvantageously saturated by the $B_0$ field.

The capacitance is advantageously tunable in order to be able to easily adjust a suitable resonance. Advantageously, the capacitance is formed from a large number of individual capacitors, which are connected suitably in parallel with each other and can be connected in such a way that the capacitance can be changed as needed. This allows to use commercially available capacitors with high quality in order to provide a tunable capacitance with high quality.

In the German patent application 102014218873, the resonant circuit, with which the maser of the present disclosure was realized, is illustrated also based on figures.

The present disclosure concerns in particular a maser having an electromagnetic resonant circuit comprising a pick-up coil, a capacitance and a filter coil, an active medium of maser-capable molecules in the pick-up coil as well as a population inversion device for generating a population inversion, specifically a partial population inversion in the active medium.

The population inversion device is preferably composed such that nuclear spins of the molecules can be brought to negative spin temperature. Alternatively, the population inversion device is preferably composed such that a complex non-equilibrium occupation (multipole order) is generated.

The maser is preferably composed such that the population inversion device comprises para hydrogen for the generation of the population inversion in the active medium in such a way that the molecules can be brought to negative spin temperature.

The maser is preferably composed such that a complex spin order can be generated at the maser-active molecules.

In particular, the population inversion device comprises a catalyst for the generation of a population inversion, in particular of a partial population inversion in the active medium or for the generation of a non-equilibrium occupation of higher order.

By means of the catalyst, the (partial) population inversion is successful in particular with para hydrogen.

In particular, the active medium is a liquid. A solid can also be beneficial. In particular, the solid consists of soft polymers or comprises soft polymers.

In one embodiment, the active medium comprises methanol.

In one embodiment, the active medium comprises an organic solvent such as methanol, specifically preferably methanol-$d_4$.

The active medium comprises in one embodiment pyridine or acetonitrile.

The active medium comprises in one embodiment substances, which can be hyperpolarized by means of para hydrogen.

The active medium comprises in one embodiment PHIP (para hydrogen induced polarization) active substances.

The active medium comprises in one embodiment SABRE (signal amplification by reversible exchange) active substances.

The active medium comprises in one embodiment nitrogenous compounds.

The active medium comprises in one embodiment one or more N-heterocyclic compounds and/or nitriles.

The active medium comprises in one embodiment pyridine and/or acetonitrile

The active medium comprises in one embodiment [IrCl(cod)(IMes)].

In one embodiment, the maser is operated in continuous operation.

Subsequently, the present disclosure is illustrated based on two embodiment examples as well as figures.

FIG. 1 shows the structure of a maser according to the present disclosure having an electromagnetic resonant circuit comprising a as pick-up coil 1 serving cylindrical coil, a tunable capacitance 2 and a filter coil 3 with a ferrite core 4. The quality of capacitance and cylindrical coil amounts to ca. 300. The pick-up coil comprises approx. 100 windings of copper and has an inner diameter of ca. 1 cm as well as a height of ca. 1 cm. The quality of the filter coil was 340.

An active medium 5 of organic or maser-capable molecules, which are dissolved in a liquid, are located in a vessel 6. The vessel 6 is arranged inside of the pick-up coil 1. In order to achieve a population inversion, specifically a partial population inversion, there is a device 7 for the generation of para hydrogen, which is led by the device 7 through a line 8 into the vessel 6 by means of an inflation needle 9 that is arranged at the end of the line 8. Thereby, the nuclear spins of the organic or maser-capable molecules are brought to a partial population inversion. A special case thereof is the negative spin temperature. The supply of para hydrogen is controlled by a valve 10.

A pressure gauge 11 monitors the pressure in vessel 6 and line 21 to monitor and control the supply of para hydrogen to vessel 6. A further needle valve 12 and a valve 13 can contribute to the control.

A transfer line 14 is formed by two strands that are twisted together, which ensures a relatively large distance (>10 cm) between the pick-up coil 1 on the one hand and the capacitance and the filter coil on the other hand. A differential amplifier 15 is connected to filter coil 3 to amplify signals from pick-up coil 1 as needed.

Pick-up coil 1, transfer line 14, tunable capacitance 2, filter coil 3 and ferrite core 4 as well as differential amplifier 15 are located within a shielding 16. Outside of the shielding 16, there is an operating and/or evaluation electronics which can display and/or evaluate the signals amplified by the differential amplifier 15. In the shown embodiment example, the electronics include an NMR operating unit 17 and a data acquisition device 18.

The shielding 16 reaches into a cylindrical coil 19 so that the vessel 6 is located centrally within the cylindrical coil 19. A static magnetic field $B_0$ is generated by the cylindrical coil 19 that is wound onto the coil body 20.

A maser with an active solid medium, which can be operated at room temperature, is known from document DOI: 10.1038/nature11339. A population inversion in the active medium is generated through optical pumping by means of a pulsating laser. Furthermore, the maser comprises a cavity resonator that is tuned to the maser frequency. In all, a maser is provided which can generate microwaves with a frequency f of approx. 1.42 GHz. Since a relatively large amount of energy is required for optical pumping, only pulsed operation is possible.

The documents DOI: 10.1038/ncomms9251 and Nature 488, 353-356 (2012) disclose considerations how a maser that can be operated at room temperature could be realized using NV centers in diamonds or optically pumped organic or maser-capable molecules in the presence of a sapphire resonator.

The lower the frequency of a maser, the longer is the wavelength of the electromagnetic waves. If a maser includes a cavity resonator, it must be sufficiently large.

If a population inversion is obtained by optical pumping, the organic medium must be provided in high optical quality and grade and thus with high technical effort.

The document DOI: 10.1038/nphys3382 discloses an NMR spectrometer with a electromagnetic resonant circuit of high quality comprising a pickup coil, a capacitance and a filter coil.

A para hydrogen gas with a portion of ca. 92% para hydrogen, which was generated at a temperature of 36K, was led with a pressure of 5 bar into the vessel containing the liquid active medium. The liquid active medium comprised as solvent 0.5 cm³ $d_4$-methanol, wherein in one case a few μl pyridine and in another case a few μl acetonitrile was dissolved. The liquid active medium further comprised a few mg [IrCl(cod)(IMes)] as catalyst.

A static magnetic field $B_0$ of ca. 1-16 mT was generated by the cylindrical coil. Though the construction, a value $\Delta B/B \sim 10^{-6}$ cm$^{-3}$ was reached.

This made it possible to generate maser oscillations which were further amplified by a lock-in amplifier after preamplification. The signals amplified in this way were recorded by the acquisition device 18 at a sampling rate of 16 kHz.

Figure 2:
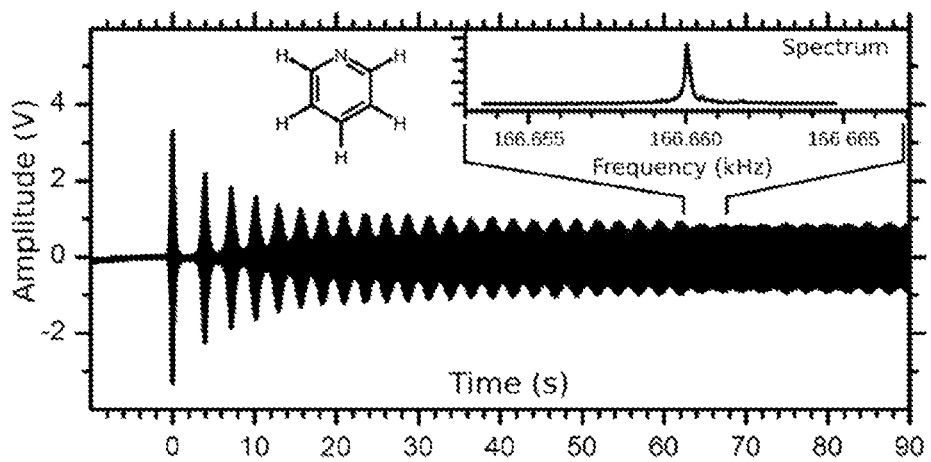
FIG. 2 shows test results (for pyridine) displaying continuous coherent electromagnetic waves generated after a transient oscillation.
Figure 3:
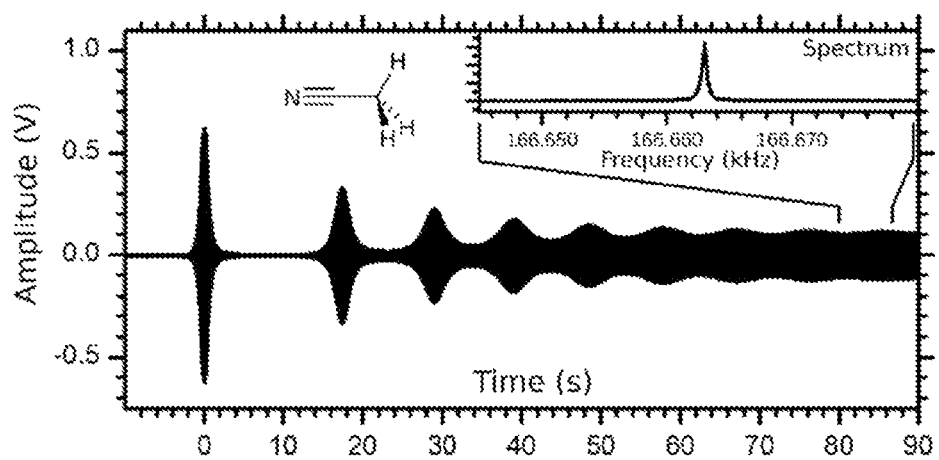
FIG. 3 shows additional test results (for acetonitrile) displaying continuous coherent electromagnetic waves generated after a transient oscillation.

The results obtained in this way are shown in FIGS. 2 (for pyridine) and 3 (for acetonitrile). It is shown the respectively measured amplitude in [V] over the time in [s]. The two figures show that continuous coherent electromagnetic waves were generated after a transient oscillation.

The invention claimed is:

1. A maser having an electromagnetic resonant circuit, the electromagnetic resonant circuit of the maser comprising a pick-up coil, a capacitance and a filter coil, an active medium of organic or maser-capable molecules in the pick-up coil as well as a population inversion device for generating a population inversion in the active medium, wherein the population inversion device comprises para hydrogen for the generation of the population inversion in the active medium in such a way that the organic or maser-capable molecules can be brought to negative spin temperature.

2. The maser of claim 1, wherein the population inversion device comprises a catalyst for generating a population inversion in the active medium.

3. The maser of claim 1, wherein the active medium is a liquid.

4. The maser of claim 1, wherein the active medium comprises methanol-$d_4$.

5. The maser of claim 1, wherein the active medium comprises pyridine or acetonitrile.

6. The maser of claim 1, wherein the active medium comprises 1.17 mg [IrCl(cod)(IMes)].

7. The maser of claim 1, wherein the filter coil and capacitance have a high quality of at least 100 or the quality of the resonant circuit is at least 200.

8. The maser of claim 1 or 7, wherein the filter coil comprises a grounded center tapping.

9. The maser of claim 1 or 7, wherein the quality of the filter coil and the quality of the capacitor exceed the quality of the pick-up coil at least by twice.

10. The maser of claim 1, wherein the filter coil is shielded by at least one of an electrical and magnetic shield.

11. The maser of claim 1, wherein there is an excitation coil that is separated from the pick-up coil.

12. The maser of claim 1, wherein the pick-up coil on the one hand and the capacitor and filter coil on the other hand are connected to each other by a low-loss electrical transfer line.

13. The maser of claim 12, wherein the transfer line is formed of two strands that are twisted together.

* * * * *